United States Patent [19]

Funaba

[11] Patent Number: 5,677,565
[45] Date of Patent: Oct. 14, 1997

[54] MONOCRYSTALLINE COMPOUND SEMICONDUCTOR WAFER INCLUDING NON-MONOCRYSTALLINE PERIPHERAL REGION

[75] Inventor: Shinji Funaba, Itami, Japan

[73] Assignee: Mitsubishi Denki Kabushiki Kaisha, Tokyo, Japan

[21] Appl. No.: 558,790

[22] Filed: Nov. 15, 1995

[30] Foreign Application Priority Data

Feb. 28, 1995 [JP] Japan ................. 7-039951

[51] Int. Cl.$^6$ ............... H01L 21/477; H01L 29/12
[52] U.S. Cl. ............ 257/620; 257/631; 437/248
[58] Field of Search .................. 257/620, 629, 257/631; 437/12, 233, 234, 939, 247, 248

[56] References Cited

U.S. PATENT DOCUMENTS

| | | | |
|---|---|---|---|
| 3,607,466 | 9/1971 | Miyazaki | 257/431 |
| 4,628,016 | 12/1986 | Yamaguchi | 430/30 |
| 5,173,127 | 12/1992 | Shimakura et al. | 257/368 |
| 5,317,186 | 5/1994 | Wills et al. | 437/939 |

FOREIGN PATENT DOCUMENTS

| | | |
|---|---|---|
| 0141725 | 6/1987 | Japan . |
| 0034931 | 2/1992 | Japan . |

OTHER PUBLICATIONS

"Newest Compound Semiconductor Handbook" published by Science Forum, 1992. pp. 80–89.
"Laser Processing", published by Nikkei Gijutsu Tosho, 1990. pp. 484–487, 290–293.

*Primary Examiner*—Peter Toby Brown
*Attorney, Agent, or Firm*—Leydig, Voit & Mayer, Ltd.

[57] ABSTRACT

A method of fabricating a semiconductor wafer includes preparing a semiconductor wafer of a monocrystalline compound semiconductor having a side surface and upper and lower surfaces, and upper and lower corners at the intersections of the side surface and the upper and lower surfaces, respectively; and producing a non-monocrystalline region at the side surface of the semiconductor wafer including the corners. Since the semiconductor wafer includes a non-monocrystalline part at the side surface including the corners, even when a crack is produced in the non-monocrystalline part, unwanted cleaving of the wafer from the crack does not occur.

5 Claims, 8 Drawing Sheets

MONOCRYSTALLINE COMPOUND SEMICONDUCTOR WAFER INCLUDING NON-MONOCRYSTALLINE PERIPHERAL REGION

FIELD OF THE INVENTION

The present invention relates a semiconductor wafer comprising a monocrystalline compound semiconductor with good cleavability and a method of fabricating the semiconductor wafer with reduced cracking and improved yield.

BACKGROUND OF THE INVENTION

Figure 10:
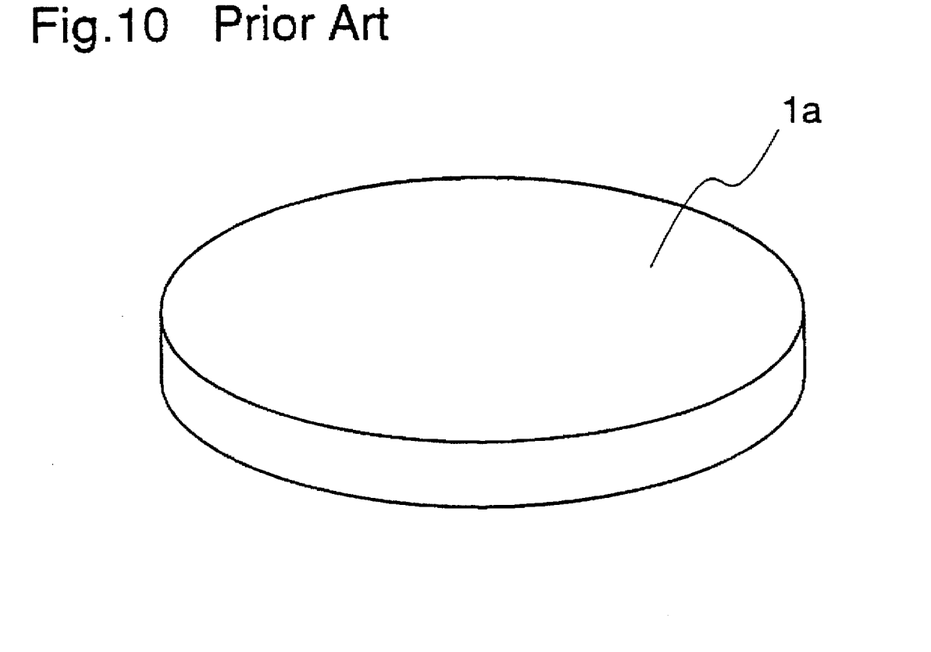
FIG. 10 is a perspective view illustrating a semiconductor wafer according to the prior art.

FIG. 10 is a perspective view illustrating a conventional semiconductor wafer. In FIG. 10, reference numeral 1a designates an InP monocrystalline semiconductor wafer. The wafer 1a is fabricated in the following process steps. Initially, a bulk monocrystalline ingot comprising InP is grown the LEC (Liquid Encapsulated Czochralski) method and shaped into a cylindrical ingot having a desired diameter. This cylindrical ingot is cut into slices of desired thicknesses. Thereafter, each slice is formed into a desired shape as needed, followed by polishing or the like.

A monocrystalline semiconductor wafer fabricated as described above is employed in an automated production line for semiconductor lasers.

Figure 11:
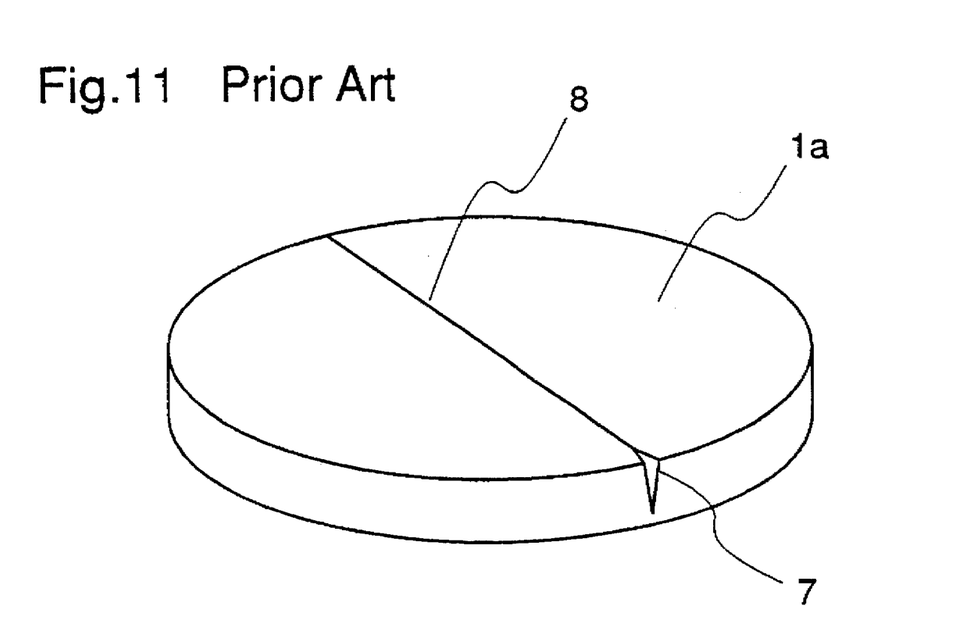
FIG. 11 is a perspective view for explaining cracking of the semiconductor wafer according to the prior art.

FIG. 11 is a perspective view of the semiconductor wafer 1a with a crack. In the figure, reference numeral 7 designates a crack and reference numeral 8 designates a cleavage line caused by the crack 7.

Generally, monocrystalline semiconductor wafers, such as GaAs or InP wafers, employed for fabrication of semiconductor lasers have high cleavability. Therefore, in the fabrication of semiconductor lasers, chip separation is performed utilizing the high cleavability of the monocrystalline semiconductor wafer along a crystal plane. More specifically, when the monocrystalline semiconductor wafer is divided into laser chips by cleaving, a specular facet is produced at the end of the laser waveguide of each laser chip.

However, in the fabrication of semiconductor lasers using a monocrystalline semiconductor wafer with high cleavability, the semiconductor wafer is sometimes cracked due to unwanted contact between the wafer and the apparatus or the like as shown in FIG. 11. Since the semiconductor wafer 1a comprises a pure monocrystalline semiconductor with high cleavability to the periphery of the wafer, the crack 7 easily extends in the crystal axis direction, resulting in breakage of the wafer 1a. That is, wafer breakage is caused by the small crack 7 produced on the peripheral part of the wafer during the fabrication process and extends in the crystal axis direction along the cleavage plane. Therefore, even the small crack 7 causes wafer breakage along the cleavage line 8 starting from the crack 7.

SUMMARY OF THE INVENTION

It is an object of the present invention to provide a monocrystalline compound semiconductor wafer having good clearability and reducing breakage of the wafer due to cracking in the wafer during the fabrication process.

It is another object of the present invention to provide a method of fabricating the semiconductor wafer.

Other objects and advantages of the invention will become apparent from the detailed description that follows. The detailed description and specific embodiments described are provided only for illustration since various additions and modifications within the spirit and scope of the invention will be apparent to those of skill in the art from the detailed description.

According to a first aspect of the present invention, a method of fabricating a semiconductor wafer includes preparing a semiconductor wafer comprising a monocrystalline compound semiconductor having good cleavability, the wafer having a side surface and upper and lower surfaces, and upper and lower corners between the side surface and the upper and lower surfaces, respectively; and producing a non-monocrystalline part at the side surface of the semiconductor wafer including the upper and lower corners. Since the semiconductor wafer fabricated in this method includes the non-monocrystalline part having no cleavability at the side surface including the upper and lower corners, even when a crack is produced in the non-monocrystalline part, unwanted cleaving of the wafer from the crack does not occur.

According to a second aspect of the present invention, the above-described method includes melting and resolidifying an edge portion of the semiconductor wafer including the upper and lower corners to change characteristics of the monocrystalline semiconductor in that portion without a macro change in the shape of the wafer, thereby producing the non-monocrystalline part. In this method, since the monocrystalline semiconductor at the side surface of the wafer is changed to non-monocrystalline semiconductor, the semiconductor wafer has no cleavability at the side surface including the upper and lower corners. Therefore, even when a crack is produced in the non-monocrystalline part, unwanted cleaving of the wafer from the crack does not occur.

According to a third aspect of the present invention, the above-described method includes applying a non-monocrystalline material to the side surface of the semiconductor wafer including the upper and lower corners, thereby producing the non-monocrystalline part. Since the semiconductor wafer fabricated in this method includes the non-monocrystalline part having no cleavability at the side surface including the upper and lower corners, even when a crack is produced in the non-monocrystalline part, unwanted cleaving of the wafer from the crack does not occur.

According to a fourth aspect of the present invention, the above-described method includes applying a laser beam to the side surface of the semiconductor wafer while rotating the semiconductor wafer, thereby melting and resolidifying the side portion of the semiconductor wafer. Therefore, the melting and resolidifying of the side portion of the semiconductor wafer is carried out with high efficiency.

According to a fifth aspect of the present invention, in the above-described method, the semiconductor wafer is a circular semiconductor wafer having a peripheral side surface, and the laser beam is applied to the circular semiconductor wafer in the tangent direction of the peripheral side surface of the circular semiconductor wafer and within the upper and lower surfaces of the wafer. Therefore, the upper and lower corners of the semiconductor wafer are simultaneously and uniformly melted and resolidified using a single laser oscillator. In addition, the laser beam is prevented from being applied to the center portion of the semiconductor wafer.

According to a sixth aspect of the present invention, the above-described method includes applying a plurality of laser beams, simultaneously or successively, to portions of the side surface of the semiconductor wafer. Therefore, the upper and lower corners of the semiconductor wafer are melted and resolidified with high reliability.

According to a seventh aspect of the present invention, a method of fabricating a semiconductor wafer includes preparing a semiconductor ingot comprising a monocrystalline compound semiconductor having good cleavability; forming the semiconductor ingot into a cylindrical semiconductor ingot having a desired diameter and a peripheral side surface; producing a non-monocrystalline part at the peripheral side surface of the cylindrical semiconductor ingot; and cutting the cylindrical semiconductor ingot into slices and polishing each slice, thereby producing a circular semiconductor wafer including a non-monocrystalline part at its peripheral side surface including upper and lower corners of the wafer. In this method, since the formation of the non-monocrystalline part of the semiconductor wafer is performed before it is sliced out of an ingot, the fabricating process is significantly simplified. Further, since the semiconductor wafer fabricated in this method includes the non-monocrystalline part having no cleavability at the side surface including the upper and lower corners, even when a crack is produced in the non-monocrystalline part, unwanted cleaving of the wafer from the crack does not occur.

According to an eighth aspect of the present invention, the above-described method includes melting and resolidifying a peripheral side portion of the semiconductor ingot to change characteristics of the monocrystalline semiconductor in that portion, thereby producing the non-monocrystalline part of the ingot. In this method, since the monocrystalline semiconductor at the side surface of the wafer is changed to non-monocrystalline semiconductor, the semiconductor wafer has no cleavability at the side surface including the upper and lower corners. Therefore, even when a crack is produced in the non-monocrystalline part, unwanted cleaving of the wafer from the crack does not occur.

According to an ninth aspect of the present invention, the above-described method includes applying a non-monocrystalline material to the peripheral side surface of the semiconductor ingot, thereby producing the non-monocrystalline part of the ingot. Since the semiconductor wafer fabricated in this method includes the non-monocrystalline part having no cleavability at the side surface including the upper and lower corners, even when a crack is produced in the non-monocrystalline part, unwanted cleaving of the wafer from the crack does not occur.

According to a tenth aspect of the present invention, the above-described method includes applying a laser beam to the peripheral side surface of the semiconductor ingot while rotating the semiconductor ingot, thereby melting and resolidifying the peripheral side portion of the semiconductor ingot. Therefore, the melting and resolidifying of the semiconductor ingot is performed with high efficiency.

According to an eleventh aspect of the present invention, the above-described method includes marking the semiconductor wafer with a laser beam. Therefore, the marked semiconductor wafer can be distinguished from other wafers.

According to a twelfth aspect of the present invention, a semiconductor wafer comprises a monocrystalline compound semiconductor wafer having good cleavability, the wafer having a side surface and upper and lower surfaces, and upper and lower corners between the side surface and the upper and lower surfaces, respectively; and a non-monocrystalline part disposed at the side surface of the monocrystalline compound semiconductor wafer including the upper and lower corners. Therefore, even when a crack is produced in the non-monocrystalline part, unwanted cleaving of the wafer from the crack does not occur.

DETAILED DESCRIPTION OF THE PREFERRED EMBODIMENTS

[Embodiment 1]

Figure 1:
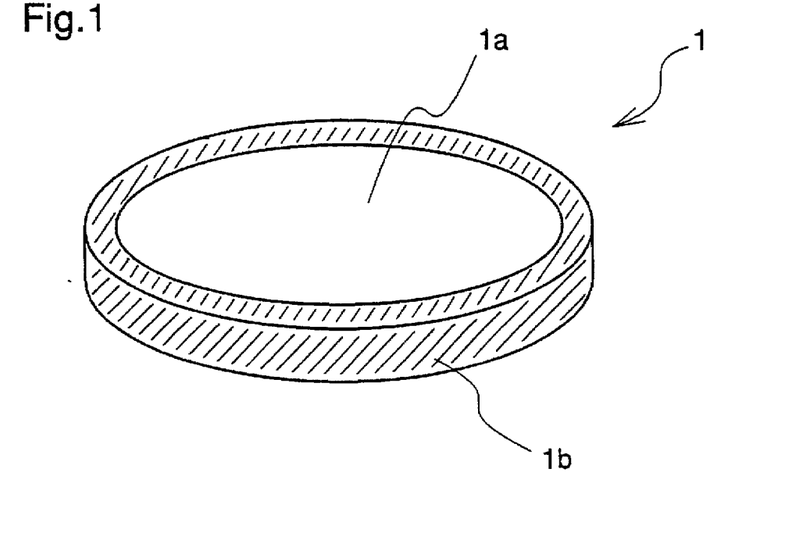
FIG. 1 is a perspective view illustrating a semiconductor wafer in accordance with a first embodiment of the present invention.

FIG. 1 is a perspective view illustrating a semiconductor wafer in accordance with a first embodiment of the present invention. In the figure, an InP monocrystalline semiconductor wafer 1 comprises a monocrystalline part 1a and a non-monocrystalline part 1b. The non-monocrystalline part 1b is a peripheral part of the wafer including corners between the side surface and the upper and lower surfaces of the wafer.

According to this first embodiment of the invention, since the semiconductor wafer 1 includes the non-monocrystalline part 1b at the periphery of the wafer including the corners between the side surface and the upper and lower surfaces of the wafer, the peripheral part of the wafer has no cleavability. Therefore, even when a small crack 7 as shown in FIG. 11 is produced on the peripheral part of the wafer during the fabrication of semiconductor lasers, the crack 7 does not extend across the wafer along the cleavage line because of the absence of cleavability in the non-monocrystalline part 1b. As a result, unwanted breaking of the wafer is significantly reduced.

[Embodiment 2]

Figure 2:
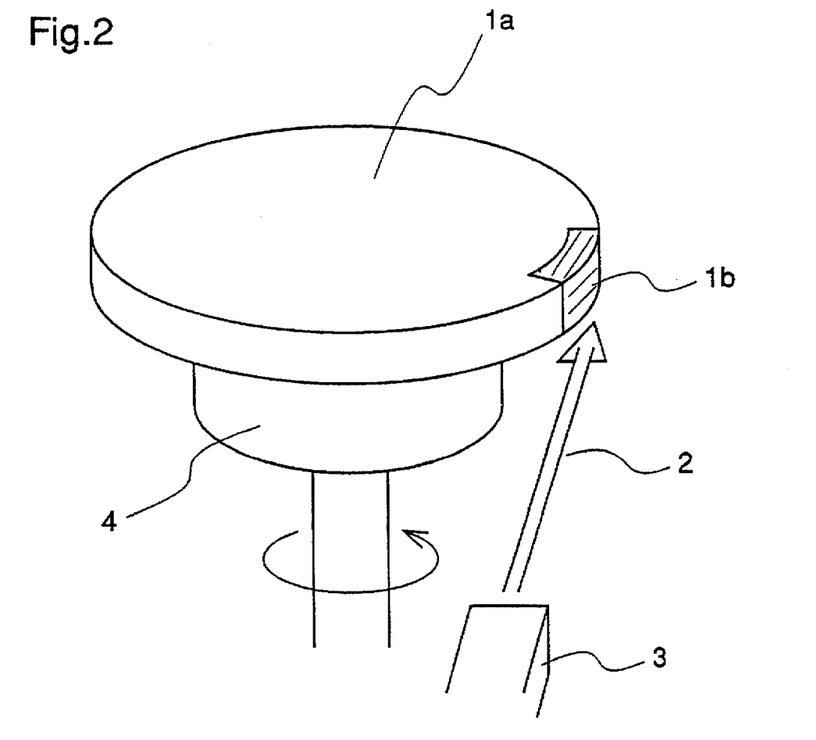
FIG. 2 is a perspective view illustrating a method of fabricating a semiconductor wafer in accordance with a second embodiment of the present invention.

FIG. 2 is a perspective view for explaining a method of fabricating the semiconductor wafer 1a shown in FIG. 1, in accordance with a second embodiment of the present invention. In the figure, the same reference numerals as in FIG. 1 designate the same or corresponding parts. Reference numeral 2 designates a laser beam for producing the non-monocrystalline part 1b in the InP monocrystalline semiconductor wafer 1a, numeral 3 designates a laser oscillator emitting the laser beam, and numeral 4 designates a rotatable susceptor on which the semiconductor wafer 1a is mounted. In this method, the non-monocrystalline part 1b of the wafer is produced by melting and resolidifying the peripheral part of the wafer using the laser beam 2.

A description is given of the method of fabricating the semiconductor wafer according to the second embodiment of the invention.

Initially, as in the prior art method, a bulk monocrystalline InP ingot is produced by the LEC method. Then, the ingot is shaped into a cylindrical ingot having a desired diameter. The cylindrical ingot is cut into slices of desired thicknesses, followed by polishing of each slice, resulting in the monocrystalline semiconductor wafer 1a.

In this second embodiment of the invention, the semiconductor wafer 1a is mounted on the rotatable susceptor 4 as shown in FIG. 2, and a part of the semiconductor wafer 1a is irradiated with the laser beam 2 emitted from the laser oscillator 3 in the direction of the tangent of the periphery of the wafer 1a to melt and resolidify that part, whereby the non-monocrystalline part 1b shown in FIG. 2 is produced. The annular non-monocrystalline part 1b shown in FIG. 1 is produced by melting and resolidifying the peripheral part of the wafer with the laser beam while rotating the susceptor 4.

Since the heating of the wafer 1a with the laser beam 2 is for producing the non-monocrystalline part 1b in the monocrystalline semiconductor wafer 1a, the intensity of the laser beam 2 should not be as high as an intensity that causes macro changes in the shape of the wafer 1a.

Although the formation of the non-monocrystalline part 1b is performed after polishing of the wafer, it may be performed before polishing of the wafer.

A description is given of the function of this second embodiment of the invention.

As described above, in this second embodiment of the invention, the peripheral part of the monocrystalline semiconductor wafer is irradiated with the laser beam 2 to melt the monocrystalline semiconductor at that part and, thereafter, the molten part is cooled and solidified, whereby the regularity of the monocrystalline semiconductor in the peripheral part is disordered and changed into a non-monocrystalline semiconductor, i.e., amorphous or polycrystalline semiconductor. The peripheral part of the wafer comprising the non-monocrystalline semiconductor has no cleavability.

In the method of fabricating a semiconductor wafer according to this second embodiment of the invention, after the circular semiconductor wafer 1a is put on the rotatable susceptor 4, the laser beam 2 is applied to the wafer in the tangential direction of the wafer. Therefore, only the peripheral part of the wafer is irradiated with the laser beam 2, and the center part of the wafer is not irradiated with the laser beam 2. Further, the corners of the wafer between the side surface and the upper surface and between the side surface and the lower surface are simultaneously irradiated with the laser beam 2 emitted from the single laser oscillator 3. Furthermore, since the heating of the peripheral part of the semiconductor wafer 1a with the laser beam 2 is carried out while rotating the wafer 1a using the rotatable susceptor 4, the cooling of the heated and molten part of the wafer is successively carried out with high efficiency. Furthermore, by appropriately selecting the intensity of the laser beam 2 and the rotating speed of the susceptor 4, conditions in the formation of the non-monocrystalline part 1b can be controlled according to the material of the semiconductor wafer and desired crystal structure.

As described above, according to the second embodiment of the present invention, the peripheral part of the monocrystalline semiconductor wafer 1a including the corners between the side surface and the upper and lower surfaces of the wafer is irradiated with the laser beam 2, applied to the wafer in the tangential direction while rotating the wafer 1a, thereby to change the characteristics of the monocrystalline semiconductor in the peripheral part with no macro change in the shape of the wafer. Therefore, the monocrystalline semiconductor in the peripheral part of the wafer can be changed into non-monocrystalline semiconductor using a single laser oscillator 3. In this wafer, even when a crack is produced in the peripheral part, since the peripheral part comprises a non-monocrystalline semiconductor having no cleavability, cleaving of the wafer does not occur from the crack. As a result, a hardly breaking semiconductor wafer is obtained.

[Embodiment 3]

Figure 3:
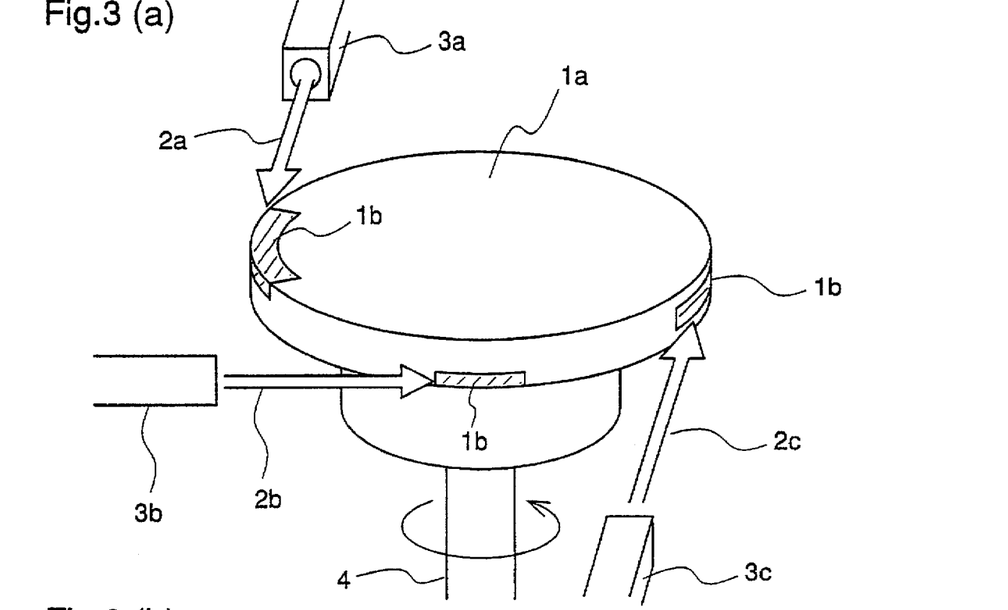
FIGS. 3(a) and 3(b) are perspective views illustrating methods of fabricating a semiconductor wafer in accordance with a third embodiment of the present invention and a modification of the third embodiment, respectively.

FIG. 3(a) is a perspective view illustrating a method of fabricating a semiconductor wafer in accordance with a third embodiment of the present invention. FIG. 3(b) shows a modification of the third embodiment. In these figures, the same reference numerals as those in FIG. 2 designate the same or corresponding parts. Reference numerals 3a, 3b, and 3c designate laser oscillators emitting laser beams 2a, 2b, and 2c, respectively. The laser beam 2a is applied to a first portion of the wafer adjacent to an upper corner between the side surface and the upper surface of the wafer, the laser beam 2b is applied to a second portion of the wafer adjacent to a lower corner between the side surface and the lower surface of the wafer, and the laser beam 2c is applied to a third portion of the wafer in the center of the side surface. These laser beams are applied to the wafer in the tangential direction of the circular wafer 1a. Non-monocrystalline semiconductor portions 1b are produced by the laser beams.

A description is given of the method of fabricating a semiconductor wafer according to the present invention.

Initially, a bulk monocrystalline InP ingot is produced by the LEC method. Then, the ingot is shaped into a cylindrical ingot having a desired diameter. The cylindrical ingot is cut into slices of desired thicknesses, followed by polishing of each slice, resulting in the monocrystalline semiconductor wafer 1a.

While in the above-described second embodiment the non-monocrystalline semiconductor part 1b is produced by irradiating a peripheral part of the wafer with a laser beam emitted from a single laser oscillator 3, in this third embodiment it is produced by irradiating the wafer with three laser beams in different directions. More specifically, after the semiconductor wafer 1a is mounted on the rotatable susceptor 4, as illustrated in FIG. 3(a), three portions of the semiconductor wafer 1a, i.e., the first portion adjacent to the upper corner between the side surface and the upper surface, the second portion adjacent to the lower corner between the side surface and the lower surface, and the third portion in the center of the side surface, are irradiated with the laser beams 2a, 2b, and 2c emitted from the laser oscillators 3a, 3b, and 3c, respectively, in the tangential direction of the semiconductor wafer, thereby producing the non-monocrystalline portions 1b. Since the irradiation of the wafer with the laser beams is carried out while rotating the susceptor 4, a semiconductor wafer having a non-monocrystalline part 1b at the entire periphery as shown in FIG. 1 is obtained. The intensity of the laser beams is the same as that described in the second embodiment of the invention.

A description is given of the function and effect of the third embodiment of the invention.

Also in this third embodiment, the laser beams 2a, 2b, and 2c are not applied to the center part of the semiconductor wafer 1a by mistake. Further, since the heating of the semiconductor wafer 1a is carried out while rotating the wafer, the cooling of the heated and molten portions of the wafer is successively carried out with high efficiency. In addition, since the semiconductor wafer 1a is irradiated with a plurality of laser beams in different directions, the upper and lower corners of the semiconductor wafer are changed into non-monocrystalline semiconductor material with high reliability.

In the method shown in FIG. 3(a), the laser oscillators 3a and 3b apply the laser beams 2a and 2b to the upper corner of the wafer between the side surface and the upper surface and the lower corner of the wafer between the side surface and the lower surface in the tangential direction of the semiconductor wafer. However, as shown in FIG. 3(b), the laser oscillators 3a and 3b may apply the laser beams 2a and 2b to the upper corner and the lower corner of the wafer in the direction perpendicular to the upper surface and the lower surface of the wafer, respectively. Also in this case, the same effects as described above are achieved.

According to the third embodiment of the present invention, since the peripheral part of the monocrystalline semiconductor wafer is irradiated with a plurality of laser beams in different directions simultaneously or successively to change the characteristics of the monocrystalline semiconductor wafer, the peripheral part of the monocrystalline semiconductor wafer including the upper and lower corners is changed into non-monocrystalline semiconductor material with high reliability. Therefore, even when a crack is produced in the non-monocrystalline peripheral part of the wafer, since this part has no cleavability, cleaving does not occur from the crack, resulting in a hardly breaking semiconductor wafer.

Although in the second and third embodiments a circular wafer is employed and a laser beam is applied to the peripheral part of the wafer including the upper and lower corners between the side surface and the upper and lower surfaces of the wafer, the method of forming a non-monocrystalline part in a monocrystalline semiconductor wafer can be applied to a circular semiconductor wafer having an orientation flat or a semiconductor wafer having a shape other than circular by controlling the position on the wafer irradiated with the laser beam using a movable laser oscillator.

[Embodiment 4]

Figure 4:
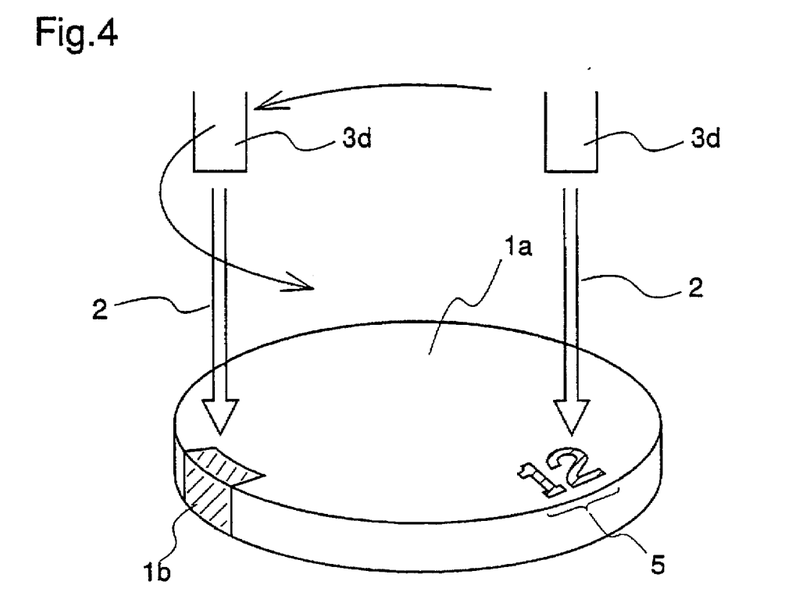
FIG. 4 is a perspective view illustrating a method of fabricating a semiconductor wafer in accordance with a fourth embodiment of the present invention.

FIG. 4 is a perspective view for explaining a method of fabricating a semiconductor wafer in accordance with a fourth embodiment of the present invention. In the figure, the same reference numerals as in FIG. 2 designate the same or corresponding parts. Reference numeral 3d designates a laser oscillator applying an identification mark 5 to a monocrystalline semiconductor wafer 1a with a laser beam (hereinafter referred to as laser marking) and melting and resolidifying a portion of the semiconductor wafer 1a to change that portion into non-monocrystalline semiconductor (hereinafter referred to as non-monocrystallization).

A description is given of a method of fabricating a semiconductor wafer according to this fourth embodiment of the invention. In this method, the process steps of forming the non-monocrystalline part 1b in the monocrystalline wafer 1a are fundamentally identical to those described in the second or third embodiment of the invention. The laser oscillator 3d shown in FIG. 4 is identical to the laser oscillator 3a shown in FIG. 3(b) except that the laser oscillator 3d has the function of laser marking in addition to the function of non-monocrystallization. In FIG. 4, laser oscillators used only for the non-monocrystallization are not shown.

Although the laser oscillator 3d has the functions of laser marking and non-monocrystallization, it may have the function of laser marking alone when it is used with the laser oscillator 3 shown in FIG. 2, or the laser oscillators 3a, 3b, and 3c shown in FIG. 3(a). Further, the laser marking may be performed on the lower surface of the wafer.

A description is given of the function of this fourth embodiment.

Since the identification mark 5 is given to the semiconductor wafer using the laser oscillator 3d for laser marking, the wafer is distinguished from other wafers with high reliability in an automated fabricating process. In addition, the front and rear surfaces of the wafer are distinguished by detecting the mark 5 optically. Although an ordinary circular semiconductor wafer has an orientation flat for detecting front and rear surfaces thereof, the orientation flat can be dispensed with in the semiconductor wafer according to this fourth embodiment.

As described above, according to the fourth embodiment of the present invention, since the identification mark is given to the semiconductor wafer using the laser oscillator for laser marking, distinguishing the wafer from other wafers and detection of the front and rear surfaces of the wafer are facilitated. In addition, in the method of forming the non-monocrystalline part in the monocrystalline wafer according to the second or third embodiment of the invention, the laser oscillator for laser marking can be used as a laser oscillator for non-monocrystallization.

[Embodiment 5]

Figure 5:
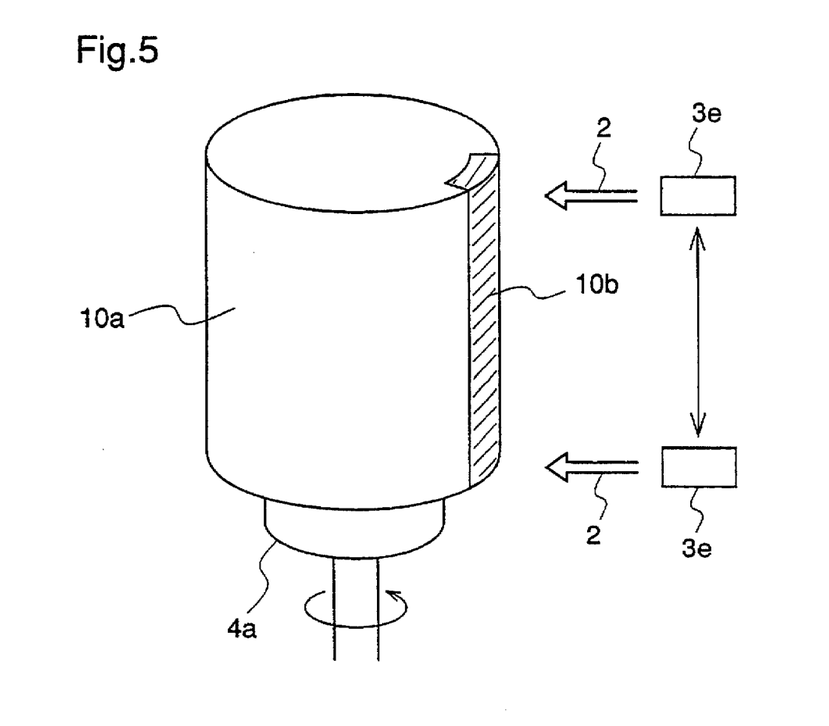
FIG. 5 is a perspective view illustrating a method of fabricating a semiconductor wafer in accordance with a fifth embodiment of the present invention.

FIG. 5 is a perspective view illustrating a method of fabricating a semiconductor wafer in accordance with a fifth embodiment of the present invention. In the figure, reference numeral 10a designates a bulk monocrystalline InP ingot, numeral 10b designates a non-monocrystalline part produced in the semiconductor ingot 10a, numeral 4a designates a rotatable ingot susceptor, and numeral 3e designates a laser oscillator emitting a laser beam 2 for making the non-monocrystalline part 10b.

A description is given of a method of fabricating a semiconductor wafer according to this fifth embodiment of the invention.

Usually, a semiconductor wafer is produced by slicing a cylindrical semiconductor ingot. In this fifth embodiment, before slicing a cylindrical semiconductor ingot 10a, a non-monocrystalline part 10b is produced at the periphery, i.e., side surface, of the ingot 10a and, thereafter, the ingot is sliced to produce a semiconductor wafer having a non-monocrystalline peripheral part.

Initially, a bulk monocrystalline InP ingot grown by the LEC method is shaped into a cylindrical semiconductor ingot 10a having a desired diameter. Then, the semiconductor ingot 10a is mounted on the rotatable susceptor 4a as shown in FIG. 5, and a portion of the side surface of the ingot 10a is irradiated with the laser beam 2 emitted from the laser oscillator 3 while rotating the susceptor 4a, whereby the peripheral portion of the monocrystalline semiconductor ingot 10a is changed into a non-monocrystalline semiconductor material. After the non-monocrystallization, the ingot is cut into slices, followed by polishing of each slice, resulting in an InP monocrystalline semiconductor wafer having a non-monocrystalline peripheral part including the upper and lower corners between the side surface and the upper and lower surfaces, respectively, as shown in FIG. 1.

A description is given of the function of this fifth embodiment of the invention.

As described above, in this fifth embodiment of the invention, a portion on the periphery of the monocrystalline semiconductor ingot 10a is irradiated with the laser beam 2 to melt the monocrystalline semiconductor at that portion and, thereafter, the molten portion is cooled and solidified, whereby the regularity of the monocrystalline semiconductor in the peripheral portion of the ingot is disordered and changed into non-monocrystalline semiconductor material, i.e., amorphous or polycrystalline semiconductor material. The peripheral portion of the ingot comprising the non-monocrystalline semiconductor has no cleavability.

In addition, since the non-monocrystalline peripheral portion is produced in the semiconductor ingot and, thereafter, the ingot is cut into slices, i.e., individual wafers, a plurality of semiconductor wafers each having a non-monocrystalline peripheral portion are produced by only one non-monocrystallization step whereas that step is performed for each semiconductor wafer in the above-described second and third embodiments.

As described above, according to the fifth embodiment of the present invention, after a monocrystalline semiconductor ingot is shaped into a cylindrical ingot having a desired diameter, a peripheral portion of the ingot is changed into non-monocrystalline semiconductor material. Then, the ingot is cut into slices, followed by polishing, to produce a plurality of semiconductor wafers each having a non-monocrystalline peripheral portion including the upper and lower corners of the wafer. Therefore, even when a crack is produced in the peripheral part of the wafer, since the peripheral part comprises non-monocrystalline semiconductor material having no cleavability, cleaving does not occur from the crack. As a result, a hardly breaking semiconductor wafer is obtained. Further, since the non-monocrystalline part of the semiconductor wafer is produced before it is cut out of the semiconductor ingot, the fabrication process is simplified.

[Embodiment 6]

Figure 6:
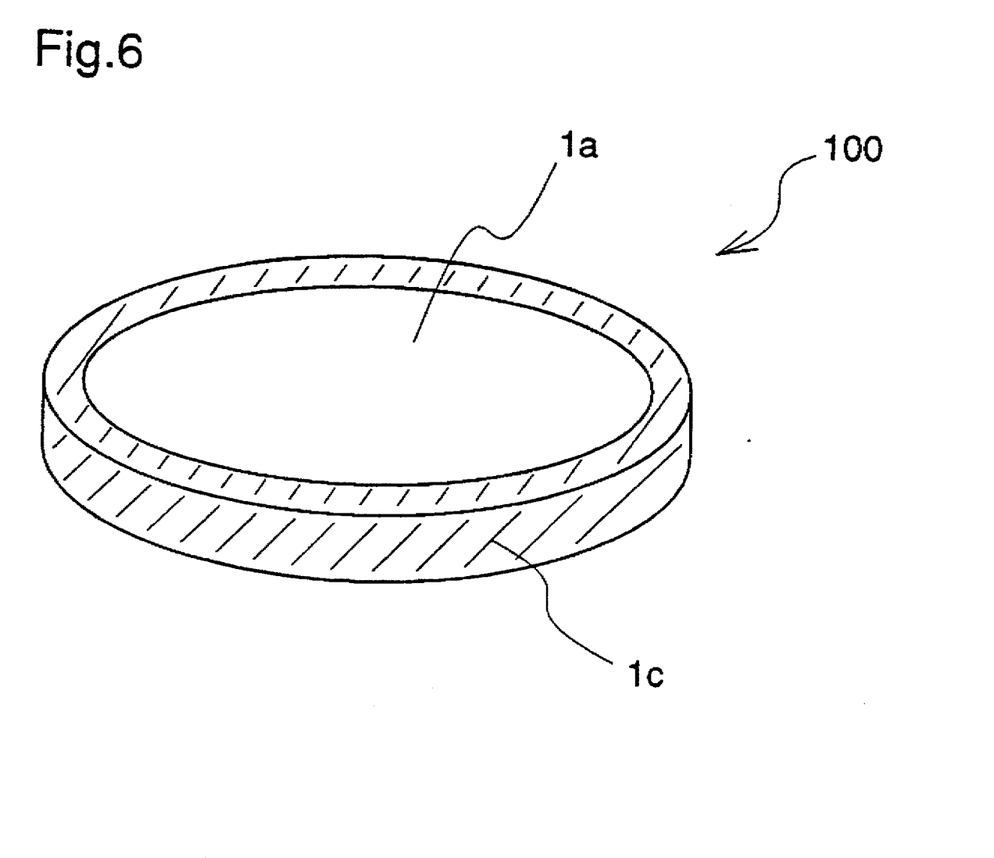
FIG. 6 is a perspective view illustrating a semiconductor wafer in accordance with a sixth embodiment of the present invention.

FIG. 6 is a perspective view illustrating a semiconductor wafer in accordance with a sixth embodiment of the present invention. In the figure, a semiconductor wafer 100 comprises a monocrystalline semiconductor wafer 1a and a non-monocrystalline part 1c. The non-monocrystalline part 1c is produced by applying a non-monocrystatline material to the peripheral side surface of the monocrystalline semiconductor wafer 1a.

As described in BACKGROUND OF THE INVENTION, since a monocrystalline semiconductor wafer, such as GaAs or InP wafer, employed for fabrication of semiconductor lasers has high cleavability, it is easily cleaved along a crystal axis from a small crack produced in the wafer during the fabrication of semiconductor lasers, resulting in unwanted breaking of the wafer. In order to avoid the breaking of the wafer, in the sixth embodiment of the invention, a non-monocrystalline material is applied to the peripheral side surface of the monocrystalline semiconductor wafer 1a.

In the semiconductor wafer 100 shown in FIG. 6, the peripheral part of the wafer including the upper and lower corners of the wafer between the side surface and the upper and lower surfaces is made of the non-monocrystalline material 1c having no cleavability. Therefore, even when a small crack is produced in the non-monocrystalline part 1c during fabrication of semiconductor lasers, since this part has no cleavability, cleaving does not occur from the crack along the crystal axis. As a result, unwanted breaking of the wafer is significantly reduced.

[Embodiment 7]

FIGS. 7(a)–7(c) are diagrams for explaining a method of fabricating a semiconductor wafer 100 as shown in FIG. 6, in accordance with a seventh embodiment of the present invention. More specifically, FIG. 7(a) is a perspective view illustrating a monocrystalline semiconductor wafer before a non-monocrystalline material is applied, FIG. 7(b) is a sectional view illustrating an apparatus for applying the non-monocrystalline material to the monocrystalline semiconductor wafer, and FIG. 7(c) is a perspective view illustrating a semiconductor wafer fabricated by the method according to this seventh embodiment of the invention. In these figures, the same reference numerals as those shown in FIGS. 2 and 6 designate the same or corresponding parts. Reference numeral 21 designates a cathode electrode, numeral 22 designates an electrical ground connected to the cathode electrode 21, numeral 23 designates $SiH_4$ reactive gas, numeral 24 designates a pipe for introducing the $SiH_4$ gas 23, numeral 25 designates a plasma of the $SiH_4$ gas 23, numeral 26 designates an anode electrode, and numeral 27 designates a high-frequency power supply.

A description is given of the fabricating method.

Figure 7:
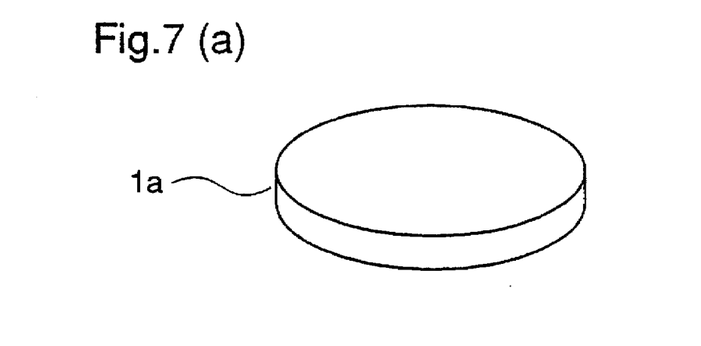
FIGS. 7(a)–7(c) are diagrams illustrating a method of fabricating a semiconductor wafer in accordance with a seventh embodiment of the present invention.

Initially, as described in the second and third embodiments of the invention, after an InP monocrystalline semiconductor ingot is produced by the LEC method, the ingot is shaped into a cylindrical ingot having a desired diameter and cut into slices, producing a monocrystalline semiconductor wafer 1a as shown in FIG. 7. The diameter of the semiconductor wafer 1a is reduced as needed in consideration of the thickness of the non-monocrystalline material which is later applied to the wafer 1a. Then, the semiconductor wafer 1a is put on a rotatable susceptor 4 of the apparatus shown in FIG. 7(b), and the non-monocrystalline material is applied to the peripheral side surface of the semiconductor wafer, preferably by plasma-CVD (Chemical Vapor Deposition), while rotating the susceptor 4, whereby a non-monocrystalline part 1c is produced on the entire side surface of the monocrystalline semiconductor wafer 1a. In this seventh embodiment, $SiH_4$ is employed as the reactive gas and amorphous silicon is employed as the non-monocrystalline material. As a result, a semiconductor wafer 100 shown in FIG. 7(c) is obtained.

A description is given of function and effect of this seventh embodiment of the invention.

In this fabricating method, the non-monocrystalline material having no cleavability is applied to the peripheral side surface of the monocrystalline semiconductor wafer 1a having cleavability, thereby producing the non-monocrystalline part 1c including upper and lower corners of the wafer 100. Therefore, even when a crack is produced in the non-monocrystalline part 1c during fabrication of semiconductor lasers, cleaving does not occur from the crack along a crystal axis.

In the seventh embodiment, the non-monocrystalline part 1c is produced by plasma-CVD of amorphous silicon. However, the material having no cleavability and applied to the side surface of the monocrystalline semiconductor wafer 1a is not restricted to amorphous silicon. Other materials having adhesion to semiconductor materials having cleavability, such as InP or GaAs, may be employed. In addition, sputtering or vacuum evaporation may be employed as the method of applying the non-monocrystalline material.

[Embodiment 8]

FIGS. 8(a)–8(c) to 9(a)–9(c) are diagrams for explaining a method of fabricating a semiconductor wafer in accordance with an eighth embodiment of the present invention. In the figures, the same reference numerals as those shown in FIGS. 7(a)–7(c) designate the same or corresponding parts. Reference numeral 10 designates a bulk monocrystalline semiconductor ingot grown by the LEC method, numeral 10a designates a cylindrical semiconductor ingot having a desired diameter made out of the ingot 10, numeral 28 designates a cutter for slicing the ingot, numeral 80 designates slices cut out of the ingot, and numeral 90 designates a semiconductor wafer after polishing.

A description is given of the fabricating method.

While in the seventh embodiment a non-monocrystalline material is applied to a semiconductor wafer, in this eighth embodiment a non-monocrystalline material is applied to a semiconductor ingot.

Figure 8:
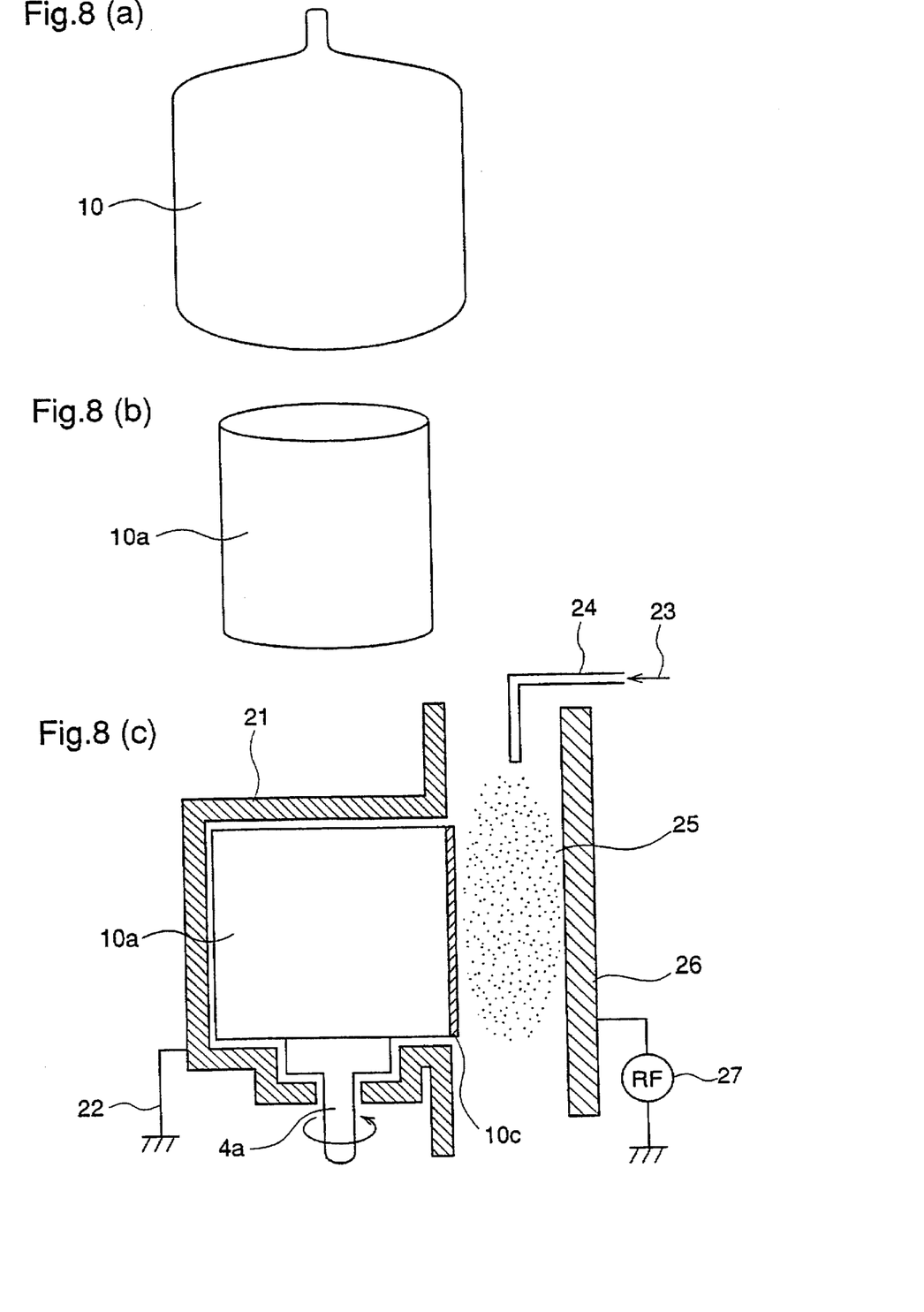
FIGS. 8(a)–8(c) and 9(a)–9(c) are diagrams illustrating a method of fabricating a semiconductor wafer in accordance with an eighth embodiment of the present invention.

Initially, a bulk monocrystalline InP ingot 10 is produced by the LEC method (FIG. 8(a)).

Thereafter, the InP ingot 10 is shaped into a cylindrical ingot 10a having a desired diameter (FIG. 8(b)). In this step, the diameter of the cylindrical ingot 10a is selected in consideration of the thickness of the non-monocrystalline material which is later applied to the ingot 10a.

In the step of FIG. 8(c), the semiconductor ingot 10a is put on a rotatable susceptor 4a, and a non-monocrystalline material is applied to the side surface of the cylindrical ingot 10a, preferably by plasma-CVD, while rotating the susceptor 4a, thereby producing a non-monocrystalline part 10c on the entire side surface of the ingot 10a. In this eighth embodiment, SiH$_4$ is employed as the reactive gas and amorphous silicon is employed as the non-monocrystalline material. The non-monocrystalline material and the method of applying that material are not restricted thereto as described in the seventh embodiment of the invention.

Figure 9:
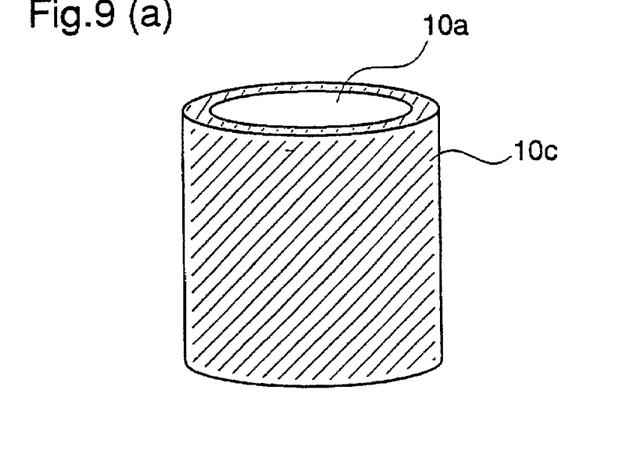

After formation of the non-monocrystalline part 1c on the entire side surface of the cylindrical ingot 10a (FIG. 9(a)), the ingot is cut into slices 80 of desired thickness with a cutter 28 (FIG. 9(b)).

Thereafter, each slice is polished to produce a semiconductor wafer 90 having a non-monocrystalline part 1c including upper and lower corners of the wafer (FIG. 9(c)).

A description is given of the function and effect of this eighth embodiment of the invention.

In this eighth embodiment, the non-monocrystalline material having no cleavability is applied to the peripheral side surface of the monocrystalline semiconductor ingot 10a having cleavability and, thereafter, the ingot 10a is sliced and polished to produce the semiconductor wafer 90 having the non-monocrystalline part 1c including the upper and lower corners of the wafer. Therefore, even when a crack is produced in the non-monocrystalline part 1c, cleaving across the wafer does not occur from the crack. In addition, a plurality of semiconductor wafers each having a non-monocrystalline part 1c are produced by only one application of the non-monocrystalline material whereas that step is performed for each semiconductor wafer in the seventh embodiment.

While in the fifth and eighth embodiments a non-monocrystalline part is produced on a peripheral side surface of a cylindrical ingot, it may be produced on a peripheral side surface of a cylindrical ingot having an orientation flat.

In the first to fourth, sixth, and seventh embodiments, the shape of the semiconductor wafer is not restricted to circular.

What is claimed is:

1. A semiconductor wafer comprising:

a monocrystalline compound semiconductor wafer having a side surface, front and rear surfaces, and corners at the intersections of the side surface and the front and rear surfaces, respectively; and a non-monocrystalline semiconductor region having a different composition from the monocrystalline wafer and disposed at the side surface of the monocrystalline compound semiconductor wafer, including the corners.

2. The semiconductor wafer of claim 1 wherein the monocrystalline wafer is InP.

3. The semiconductor wafer of claim 1 wherein the non-monocrystalline region is an amorphous semiconductor.

4. The semiconductor wafer of claim 3 wherein the amorphous semiconductor is silicon.

5. The semiconductor wafer of claim 4 wherein the monocrystalline wafer is InP.

* * * * *